United States Patent [19]
Lee et al.

[11] Patent Number: 5,404,330
[45] Date of Patent: Apr. 4, 1995

[54] WORD LINE BOOSTING CIRCUIT AND CONTROL CIRCUIT THEREFOR IN A SEMICONDUCTOR INTEGRATED CIRCUIT

[75] Inventors: Yeong-Taek Lee; Jong-Hyeon Choi, both of Seoul, Rep. of Korea

[73] Assignee: Samsung Electronics Co., Ltd., Suwon, Rep. of Korea

[21] Appl. No.: 161,851

[22] Filed: Dec. 6, 1993

[30] Foreign Application Priority Data

Dec. 5, 1992 [KR] Rep. of Korea ............. 23380/1992

[51] Int. Cl.⁶ ............................................. G11C 7/00
[52] U.S. Cl. .......................... 365/189.11; 365/230.03; 365/230.06
[58] Field of Search ............ 365/189.11, 230.03, 365/230.06, 189.09, 226, 200

[56] References Cited
U.S. PATENT DOCUMENTS

| | | | |
|---|---|---|---|
| 5,038,325 | 8/1991 | Douglas | 365/189.11 |
| 5,247,480 | 9/1993 | Itoh | 365/189.11 |
| 5,267,201 | 11/1993 | Foss | 365/226 |

*Primary Examiner*—Eugene R. LaRoche
*Assistant Examiner*—A. Zarabian
*Attorney, Agent, or Firm*—Charles R. Donohoe; Robert A. Westerlund, Jr.; Stephen R. Whitt

[57] ABSTRACT

A word line boosting circuit and a control circuit therefor in a semiconductor integrated circuit are included. A word line boosting control circuit is connected to receive block select information selecting a first or second memory cell array block synchronized to a predetermined row address, and selectively generates first and second word line voltages.

14 Claims, 8 Drawing Sheets

WORD LINE BOOSTING CIRCUIT AND CONTROL CIRCUIT THEREFOR IN A SEMICONDUCTOR INTEGRATED CIRCUIT

BACKGROUND OF THE INVENTION

The present invention relates to semiconductor integrated circuits, and more particularly to a word line boosting circuit for supplying a constant voltage level word line signal and a control circuit therefor.

Generally, in a semiconductor integrated circuit such as a dynamic random access memory (DRAM), a memory cell consists of one access transistor and one storage capacitor. Data of a high "1" or low "0" voltage level, for example, is stored in the storage capacitor. The data stored in the storage capacitor is transferred to a bit line through the channel of the access transistor. The speed that the data is transferred to the bit line and the a voltage level of the signed transferred depend on the voltage level of a word line applied to the gate of the access transistor. With high integration density and larger capacity semiconductor memory integrated circuits, high speed operation is required. The highest integration density of the chip has led to the use of a lower operating supply voltage due to the reduction of the size of the transistor. With such a low supply voltage, the voltage level of the word line applied to the gate of the access transistor within the memory cell is not enough to transfer the data stored in the storage capacitor to the bit line using conventional voltage boosting circuitry. As a result, lower operating speeds and other disadvantages occur.

To overcome such problems, new voltage boosting circuits (also known as a boosting circuit or, more specifically a "word line boosting circuit") for generating a boosting voltage over a supply voltage within the chip have been proposed FIGS. 1A and 1B illustrate block diagrams of prior art voltage boosting circuits. As shown in FIG. 1A, word line boosting circuit 1 utilizing a charge pumping provides a word line W/L voltage higher than a supply voltage Vcc. The boosting level is determined by a charge sharing ratio between a pumping capacitor (not shown) and the parasitic capacitance of the word line being enabled. If the size of the pumping capacitor is larger than that of the parasitic capacitance of the word line, the boosting level is raised. Therefore, the size of the pumping capacitor of the word line boosting circuit 1 should enable a voltage greater than Vcc+Vtn (VtN being the threshold voltage of the access transistor of the memory cell). If the size of the pumping capacitor is too large relative to the word line loading, the word line voltage becomes too high and excessive stress is applied to the access transistor, thereby shortening the life of the chip. On the other hand, if the size of the pumping capacitor is too small, the voltage of data line is not sufficiently transferred to the storage capacitator of the memory cell. Thus, when using the conventional word line boosting circuit, the loading of the word line should be constant to maintain a uniform word line level.

FIG. 1B shows a block diagram of a word line boosting circuit for a highly integrated semiconductor circuit. Two memory cell arrays 3A and 3B are connected to one word line boosting circuit 1, and the coding processes of row decoders 2A and 2B are different than with respect to FIG. 1(a) for selecting a word line enabled during a circuit operation. A single word line boosting circuit is used to boost the word line voltage of either a single memory cell array or two memory cell arrays. However, depending on how the word line boosting circuit is designed, operation characteristics will vary. If the word line boosting circuit is designed in considering word line loading when both array blocks 3A and 3B are enabled, the word line voltage is too high when only one array block is enabled, with the result that the excessive stress is applied and the life of a memory device is shortened. If the word line boosting circuit is designed considering the case when one array block is enable, the word line loading when one array block is enabled, a boosting voltage that is too small relative to the size of the pumping capacitor of the word line boosting circuit is generated when one array block is enabled, thereby lowering the word line voltage. Thus in such a word line boosting process, it is difficult to supply a stable word line voltage, and as a result, reliable operation of the semiconductor integrated circuit can not be realized.

SUMMARY OF THE INVENTION

Accordingly, it is an object of the present invention to provide a word line boosting circuit that improves the reliability of a semiconductor integrated circuit.

It is still another object of the present invention to provide a word line boosting control circuit for maintaining a constant word line voltage regardless of word line loading.

It is still another object of the present invention to provide a word line boosting control circuit for maintaining a constant word line voltage irrespective of word line loading by receiving predetermined block select information.

It is a still further object of the present invention to provide a word line boosting circuit additionally included in a normal cell array and a spare cell array, respectively.

It is a still further object of the present invention to provide a word line boosting circuit included in a normal cell array and a spare cell array, respectively, and having a boosting control circuit for adjusting a word line boosting level.

According to the present invention, a semiconductor integrated circuit includes first and second memory cell arrays for respectively storing a plurality of memory data, a first row decoder for selecting memory cells of the first memory cell array, and a second row decoder for selecting memory cells of the second memory cell array. A word line boosting circuit connected to said first and second row decoders generates a boosting voltage to access data of the memory cells during an access operation. A word line boosting control circuit adjusts the output level of the word line boosting circuit according to the number of memory arrays selected, both when the first and second memory cell arrays are simultaneously selected and when the first and second memory cell arrays are independently selected. Block select information is used to control this word line boosting control circuit. Preferably, the word line boosting control circuit reduces an output level of the word line boosting circuit when either the first or second memory cell array is selected, and maintains the output level of the word line boosting circuit when both the first and second memory cell arrays are selected.

BRIEF DESCRIPTION OF THE DRAWINGS

The advantages and features of the present invention will be more apparent from the detailed description hereunder, with reference to the attached drawings, in which.

DETAILED DESCRIPTION OF THE PREFERRED EMBODIMENT

Figure 2A:
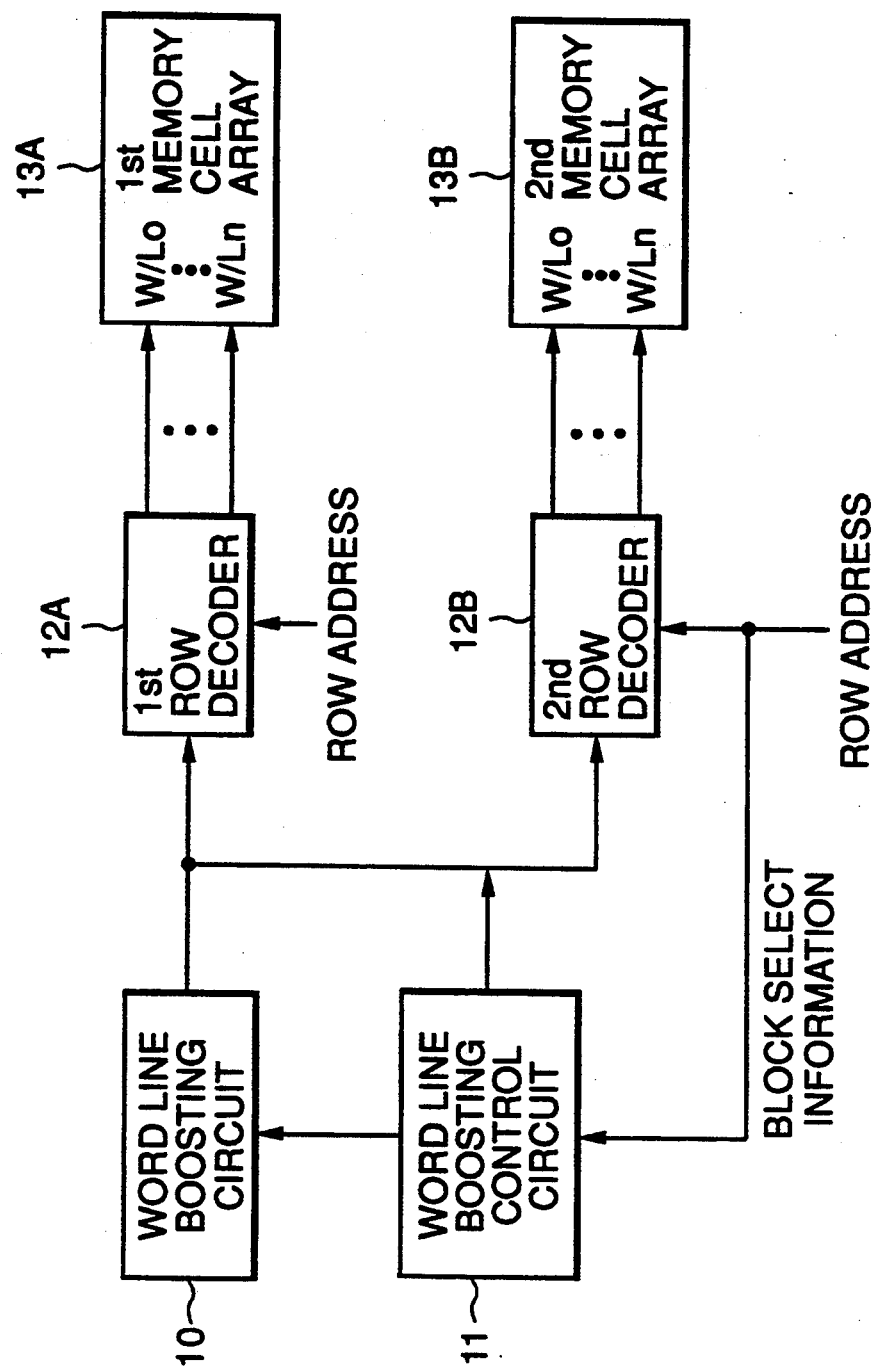
FIGS. 2A and 2B are block diagrams illustrating a word line boosting process with a word line boosting circuit and a control circuit according to the present invention.

FIG. 2A shows a block diagram of a word line boosting circuit for use in a DRAM and a word line boosting control circuit according to the present invention.

First and second memory cell arrays 13A and 13B store a plurality of memory cells. A first row decoder 12A selects the memory cell of the first memory cell array 13A, and a second row decoder 12B selects the memory cell of the second memory cell array 13B. A word line boosting circuit 10, connected to the first and second row decoders 12A and 12B, generates a boosting voltage over a supply voltage, in order to fully access data of the memory cell during an access operation for a prescribed memory cell. A word line boosting control circuit 11, connected to the word line boosting circuit 10, receives block select information for selecting the first or second memory cell array 13A or 13B, and differently adjusts the output level of the word line boosting circuit 10 for two different conditions: when the first and second memory cell arrays 13A and 13B are simultaneously selected and when the memory cell arrays 13A and 13B are independently selected, using the block select information.

During an operation, word lines of a constant number in the first memory cell array 13A are always selected by the first row decoder 12A and the first memory cell array 13A is connected to the word line boosting circuit 10. Only when a specific address is entered by the second row decoder 12B, are the word lines of a constant number in the second memory cell array 13B enabled and the second memory cell array 13B connected to the word line boosting circuit 10. If only the first memory cell array 13A is enabled, the loading in the word line boosting circuit 10 corresponds to the number of word lines enabled in the first memory cell array 13A. If both first and second memory cell arrays 13A and 13B are enabled, the loading of the word line enabled in the first memory cell array 13A is added to that enabled in the second memory cell array 13B. The word line boosting control circuit 11 receives the select information of the second memory cell array 13B and offsets the variation of the word line loading by controlling the word line boosting circuit 10 and the output thereof according to the operation of the second memory cell array 13B. Hence the voltage level of the word line supplied to the memory cell arrays 13A and 13B is constant when either one or two memory cell arrays are selected.

Figure 2B:
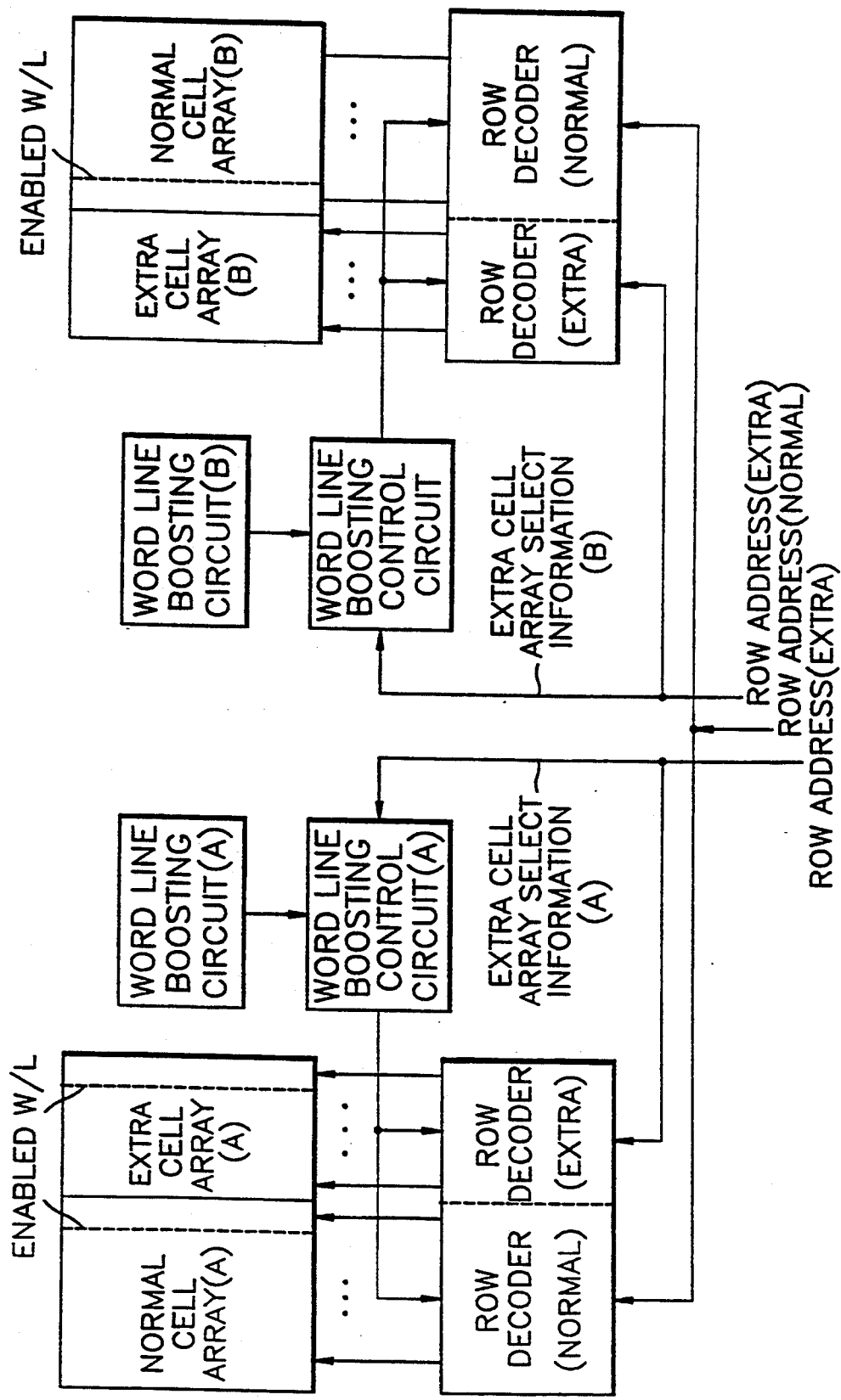

Referring to FIG. 2B, block diagrams of the word line boosting circuit and the word line boosting control circuit according to the present invention are illustrated in a block diagram of a memory cell array having an extra cell array. This extra memory cell array is quite different from a spare or redundant cell array included to replace a defective cell, well known in the field of the semiconductor integrated memory circuits. The extra memory cell array is arranged adjacent to a normal memory cell array within the chip to store a parity bit, and is mainly used in byte-wide memory such as x9 and x18-series rather than x8 and x16-series to generate the parity bit during an output operation. FIG. 2B shows the array structure when the memory cell array has the extra cell array. In order to raise the efficiency and simplify layout and to prevent current during an active operation from unbalancing, normal cell arrays are symmetrically divided to both sides. Therefore, the word lines of a constant number operate at each block and input/output data of the same number is connected. Thus, in the symmetrical arrangement of the memory cell array, the extra cell array is added symmetrically as well. The extra cell array has the same arrangement as the normal cell array. However, if one word line enabled in the extra cell array is needed, only one of two divided extra cell arrays is enabled. Two word line boosting circuits are required, one for each side of the symmetrical arrangement, due to the limit of the size of the pumping capacitor, simplification of the layout, simplified signal line bussing processing, etc. Since the extra cell array asymmetrically operates with the normal cell array in one array block, the loading of the word line connected to the word line boosting circuit is also asymmetrical. Therefore, in order to constantly maintain the voltage level of the word line irrespective of the operation of the extra cell array, the word line boosting control circuit extra cell array select information to distinguish between a condition of selecting the extra cell array or not.

Figure 1A:
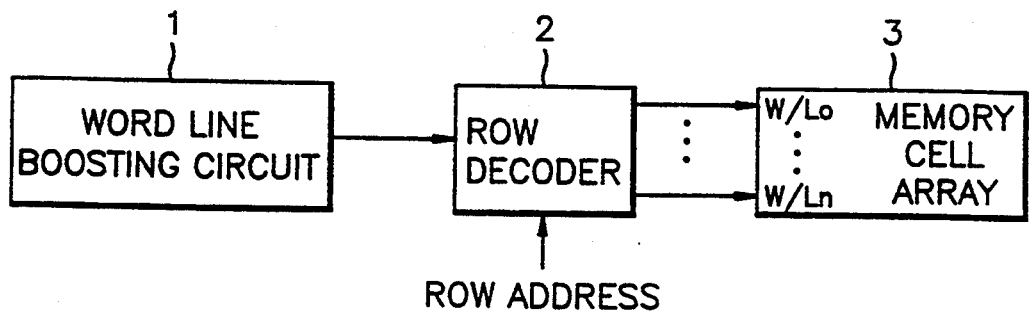
FIGS. 1A and 1B are block diagrams illustrating a conventional word line boosting process.
Figure 1B:
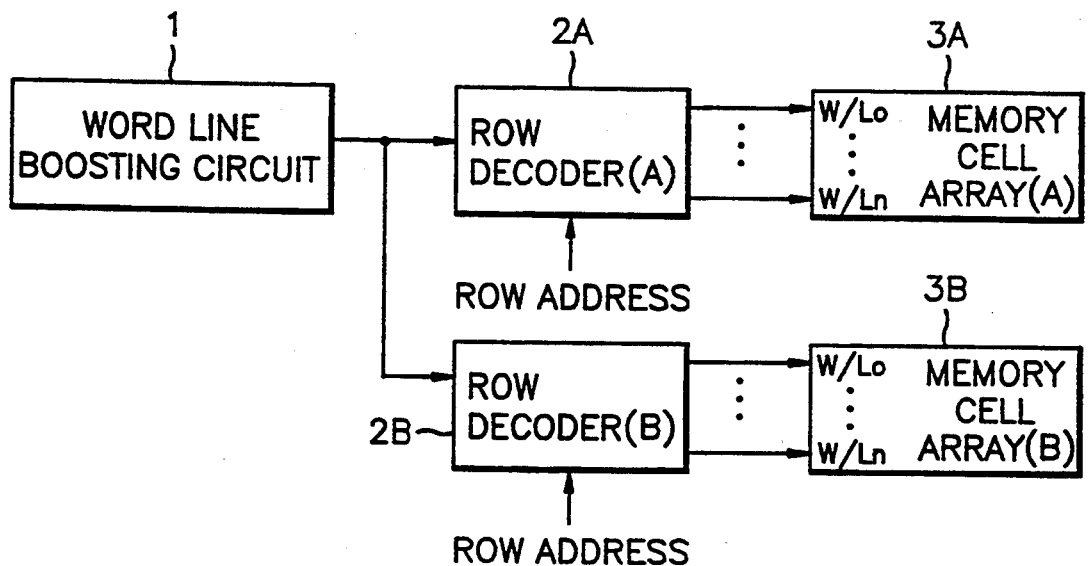
Figure 3:
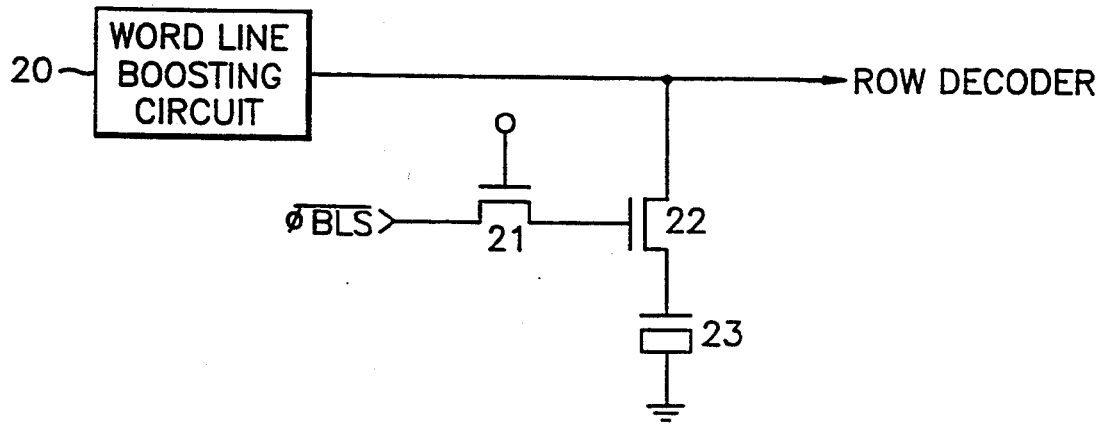
FIG. 3 illustrates one embodiment of a word line boosting control circuit according to the present invention.

FIG. 3 shows one embodiment of a word line boosting control circuit of FIGS. 2A and 2B. A pass transistor 21 is connected to receive block select information $\phi BLS$. A pull-down transistor 22 has its gate connected to the channel of the pass transistor 21. One terminal of the channel of pull-down transistor 22 is connected to an output terminal of a word line boosting circuit 20. A capacitor 23 is connected between the other terminal of the channel of the pull-down transistor 22 and a ground voltage terminal and discharges current flowing into the channel of the pull-down transistor 22. The block select information $\overline{\phi BLS}$ has an opposite state to a signal $\overline{\phi BLS}$ which enables the extra cell array of FIG. 2B for example. If the extra cell in the extra cell array is selected, the block select signal $\overline{\phi BLS}$ is lowered to logic "low" and the pull-down transistor 22 is turned off. Then a voltage level generated by the word line boosting circuit 20 is transferred to the word line. If the extra cell array is not selected, the block select information $\overline{\phi BLS}$ is raised to logic "high" and the pull-down transistor 22 is turned on. Then the charge which is capable of driving the word line loading of the extra cell array goes through the capacitor 23. Therefore, the word line loading is offset by the capacitor 23 and the voltage level of the word line is the same as the case that the extra cell array is enabled. It is desirable that the size of the capacitor 23 is determined by the word line loading of the extra cell array.

Figure 4A:
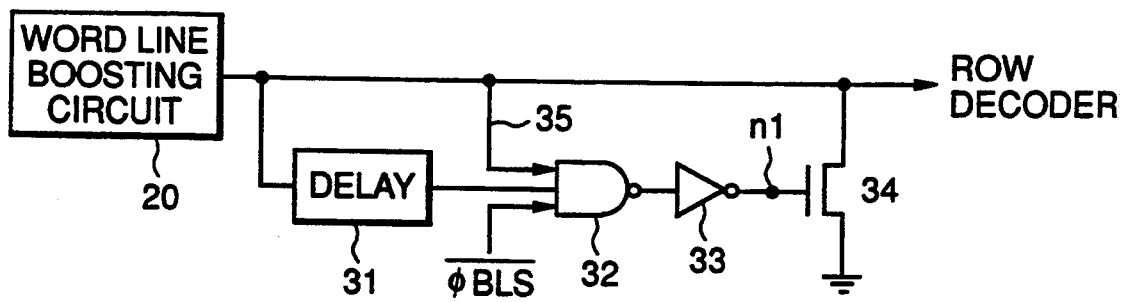
FIGS. 4A, 4B and 4C illustrate another embodiment of a word line boosting circuit according to the present invention.

FIG. 4A shows another embodiment of the word line boosting control circuit of FIG. 2A and 2B. A 3-input NAND gate 32 receives a first input of the output terminal of the word line boosting circuit 20, a second input generated from a delay 31 connected to the output terminal of the word line boosting circuit 20 and a third input of the block select information $\overline{\phi BLS}$. An inverter 33 is serially connected to the output terminal of the NAND gate 32. A pull-down transistor 34 has its gate connected to the inverter 33 and the channel connected between the output terminal of the word line boosting circuit 20 and a ground voltage terminal. Pull down transistor 34 selectively discharges the voltage level of the output signal of the word line boosting circuit 20 according to the output of the NAND gate 32. A delay 31 is used for further control of NAND gate 32.

Figure 4B:
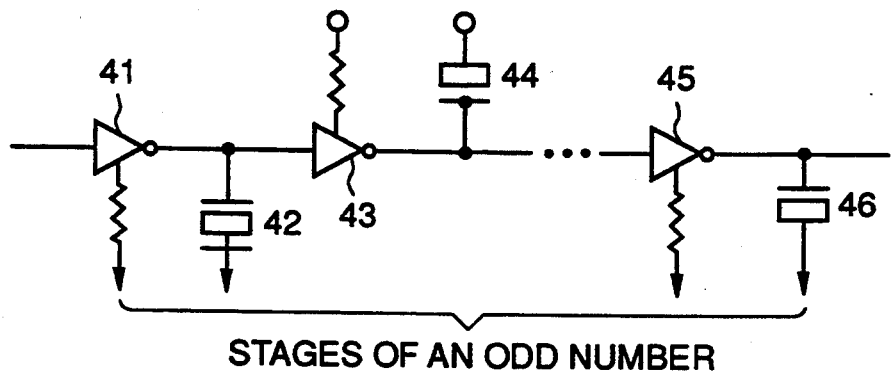
Figure 4C:
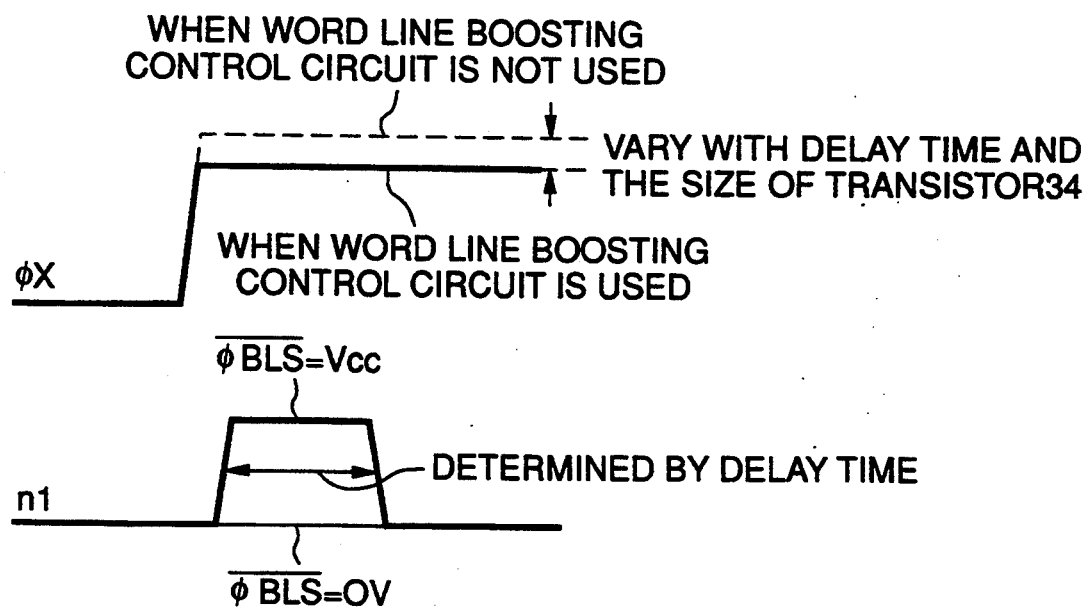

If the extra cell array is enabled, the block select information $\overline{\phi BLS}$ is lowered to logic "low". A gate node n1 of the transistor 34 is set to 0 V and the transistor 34 is turned off. Hence, the output of the word line boosting circuit 20 is transferred to the word line. If the extra cell array is not enabled, the block select information $\overline{\phi BLS}$ of a logic "high" level is applied to the NAND gate 32. At the time the output of the word line boosting circuit 20 is raised to logic "high", a signal line 35 is set to logic "high" and the signal line 35 of the logic "high" level is applied to the NAND gate 32. The delay 31, which consists of inverters of an odd number, because the previous output of the word line boosting circuit 20 was set to a logic "low", is set to logic "high". Then the NAND gate 32 generates logic "low" and the node n1 is set to logic "high". Then the transistor 34 is turned on and only the charge needed to drive the word line loading of the extra cell array goes through the transistor 34, thereby offsetting the word line loading of the spare cell array. However, if the output of the delay 31 changes to logic "low" after a given period of time elapses, the NAND gate 32 generates logic "high". Then the transistor 34 is turned off. The delay 31 preferably uses general inverters 41, 43, ..., 45, resistors, and capacitors 42, 44, ... 46 as shown in FIG. 4B. The delay time is determined by the number of inverters, resistors connected thereto, the number of capacitors and the size thereof. Since the delay time determines a pulse width at the node n1 transferred to the gate of the transistor 34, as indicated in FIG. 4C, it should be determined in consideration of the word line loading of the extra cell array. In order to generate a pulse, since a phase opposite to the output of the word line boosting circuit 20 should be made, and odd number inverters are required.

Figure 5:
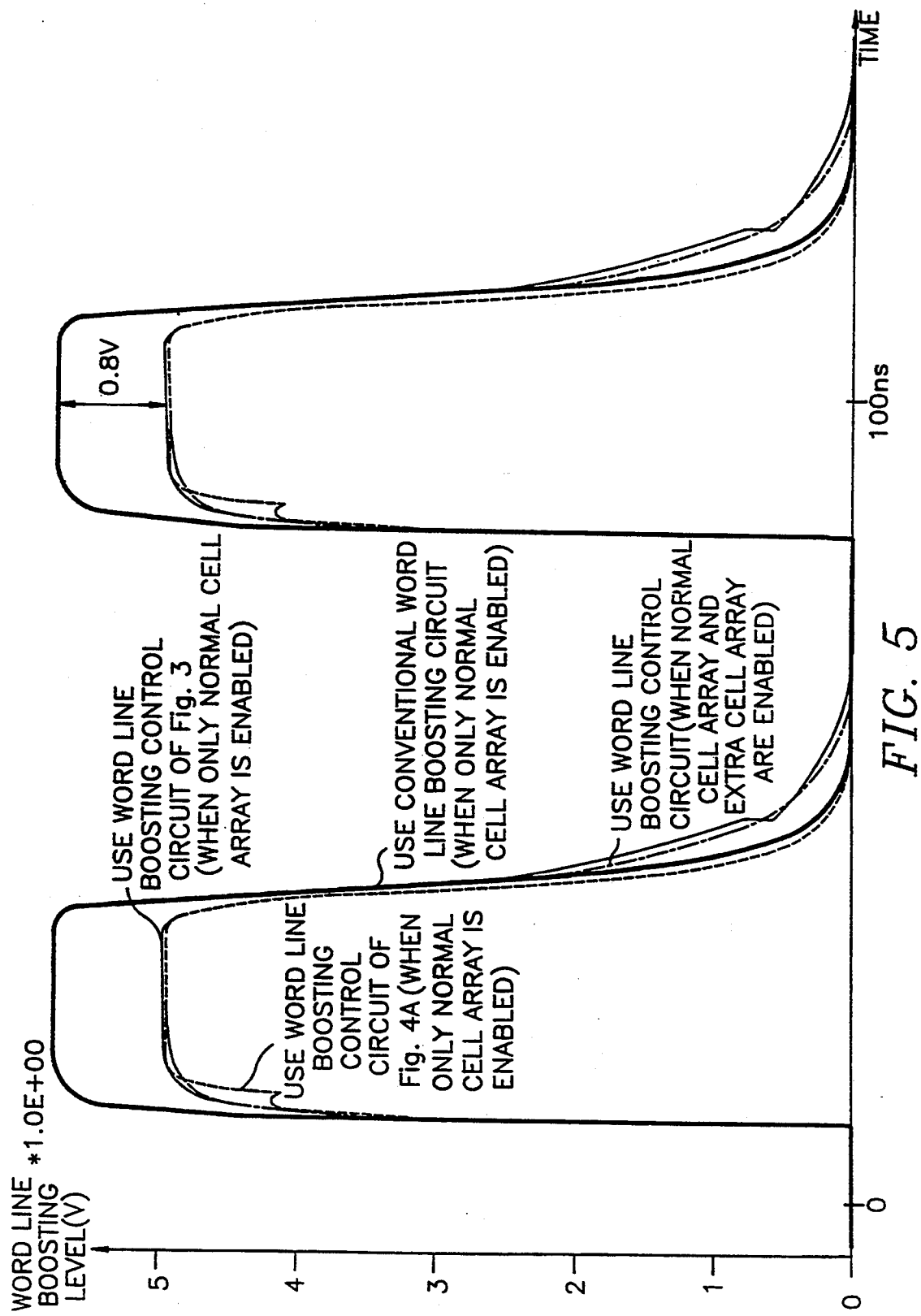
FIG. 5 is waveforms showing the output characteristic of a word line boosting circuit in the case that a word line boosting control circuit is used and it is not used, when word line loading varies.

FIG. 5 is waveforms showing the output characteristics of the word line boosting circuit when the word line boosting control circuit is used and is not used in situations when the word line loading varies. In the simulation of FIG. 5, the supply voltage Vcc is 4 V and the capacitance loading of the normal cell array and extra cell array is about 30 pF (pico farad = $10^{-12}$ farad), respectively. When only the normal cell array is enabled in a conventional word line boosting process, the word line boosting level is higher, by about 0.8 V, than that when both normal cell array and the extra cell array are enabled. However, when the word line boosting control circuit according to the present invention is used, the word line boosting levels when only normal cell array is enabled and when both normal cell array and extra cell array are enabled are almost the same. The size of capacitor used in the word line boosting control circuit is 30 pF, which is similar to the word line loading of the extra cell array. The size of the pull-down transistor (transistor 34 of FIG. 4A) of the word line boosting control circuit is W/L = 100/1.1 and the pulse width by the delay time is approximately 5 ns(nano seconds).

Figure 6:
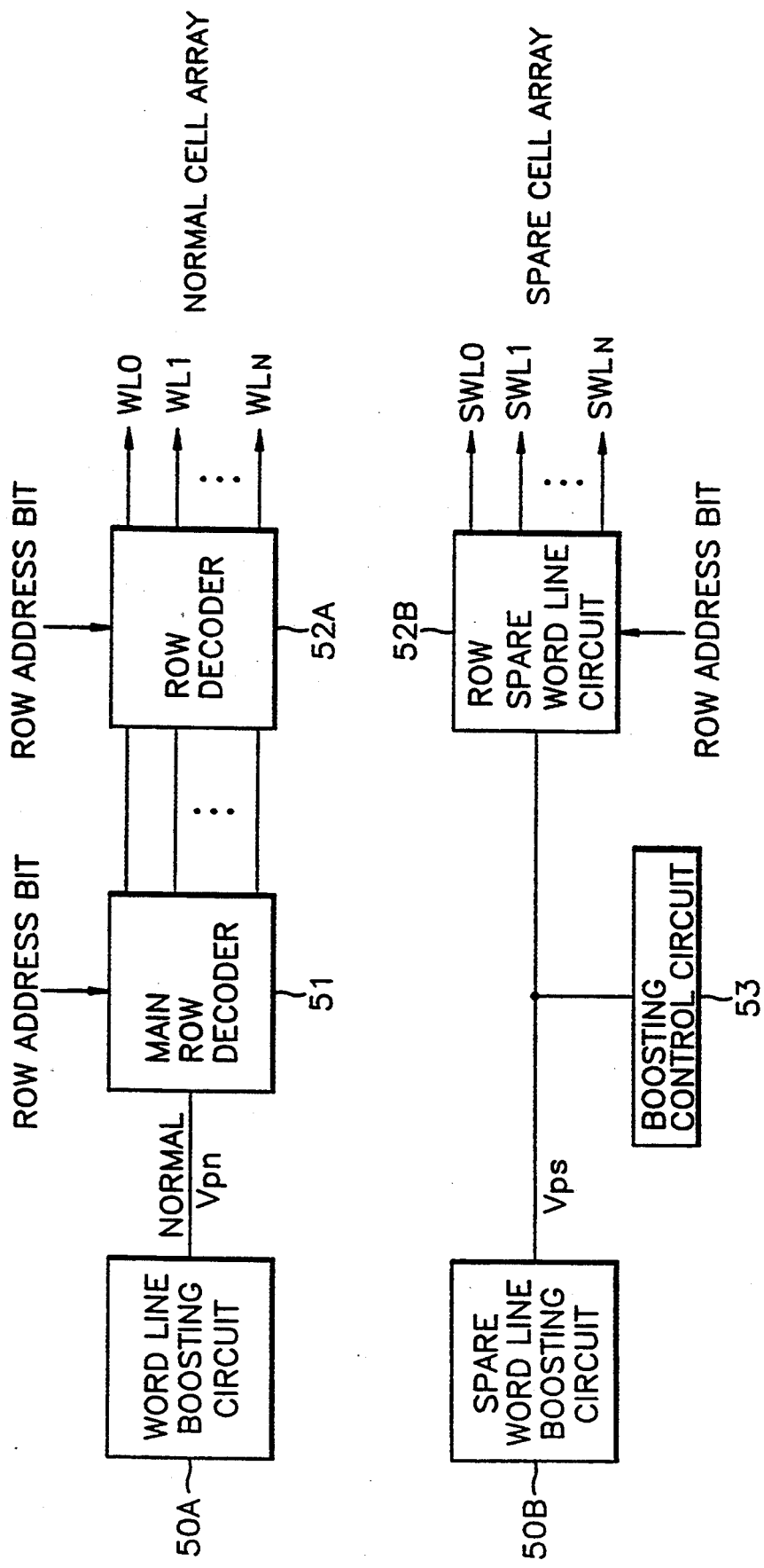
FIG. 6 is a block diagram illustrating an example in the case that a word line boosting circuit and word line boosting control circuit according to the present invention are applied to a spare word line.

In FIG. 6, the word line boosting circuit and control circuit according to the present invention are applied to a spare word line boosting circuit. Thus, the word line boosting circuit including the word line boosting control circuit according to the present invention can be applied to the spare cell array in order to replace a defective cell. Since the voltage level of the word line supplied to the spare cell array included in a general DRAM is similar to that supplied to the normal word line, the problem of excessive stress can be overcome. A difference in the loading between the normal word line and spare word line, respectively, connected to a word line boosting circuit 50A and a spare word line boosting circuit 50B is compensated by any boosting control circuit (a boosting control circuit 53 is included in the spare word line). The word line boosting circuit 50A connected to the normal word line and the spare word line boosting circuit 50B connected to the spare word line have different structure to separately operate boosting transmission lines of the normal word line and spare word line. By so doing, the word line boosting circuit 50A and spare word line boosting circuit 50B are separately provided and the boosting voltage level of each final stage identical to the word line boosting voltage can be supplied. Since the loading is different for the memory cell array through row decoders 52A a boosting transmission line Vpn of the normal word line and the spare cell array through row decoders 52B and the boosting transmission line of the spare word line, if the voltages Vpn and Vps are the same, the voltage level of the final stage is naturally different. The voltage level of the final stage can be adjusted to the same level by separately constructing the word line boosting circuits 50A and 50B one of which uses a boosting control circuit according to the present invention.

Figure 7A:
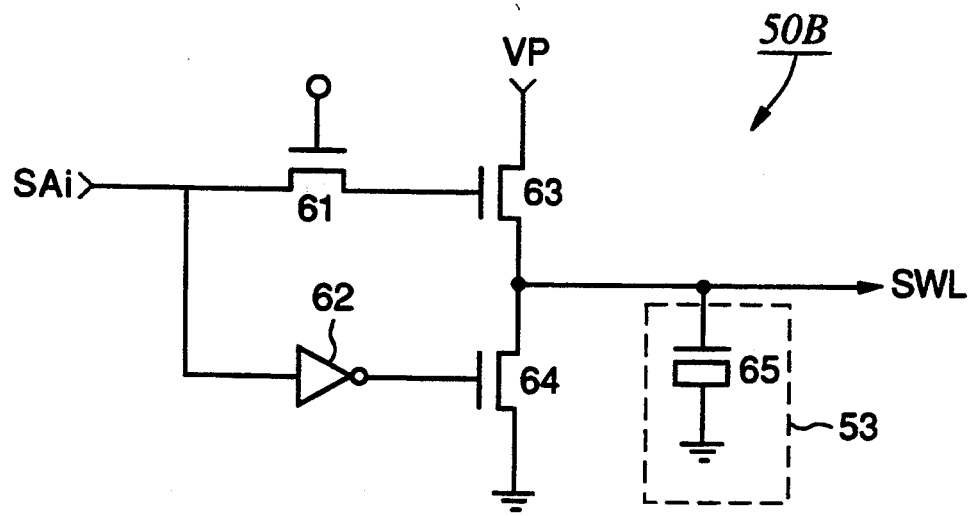
FIG. 7A and 7B are more detailed circuit diagrams of a spare word line boosting circuit and a boosting control circuit of FIG. 6.

FIG. 7A is a detailed circuit diagram of the spare word line boosting circuit 50B and the boosting control circuit 53 of FIG. 6. Since the loading of a spare word line SWL is small, a capacitor 65, with one electrode terminal connected to a ground voltage and the other electrode terminal connected to the spare word line SWL, is used to maintain equal loading with a normal word line WLi. Therefore, the normal word line WLi and spare word line SWL have the same voltage level. The size of the capacitor 65 should be appropriately adjusted in consideration of the voltage level supplied to the spare word line.

Figure 7B:
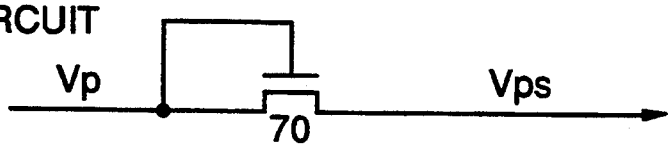

Referring to FIG. 7B, the voltage level of the spare word line is dropped by a threshold voltage Vt by use of an NMOS diode as a clamp device, installed at a path to which the output of the spare word line boosting circuit 50B is transferred. Therefore, overvoltage stress is not applied to the spare cell array and the reliability is ensured.

Figure 8:
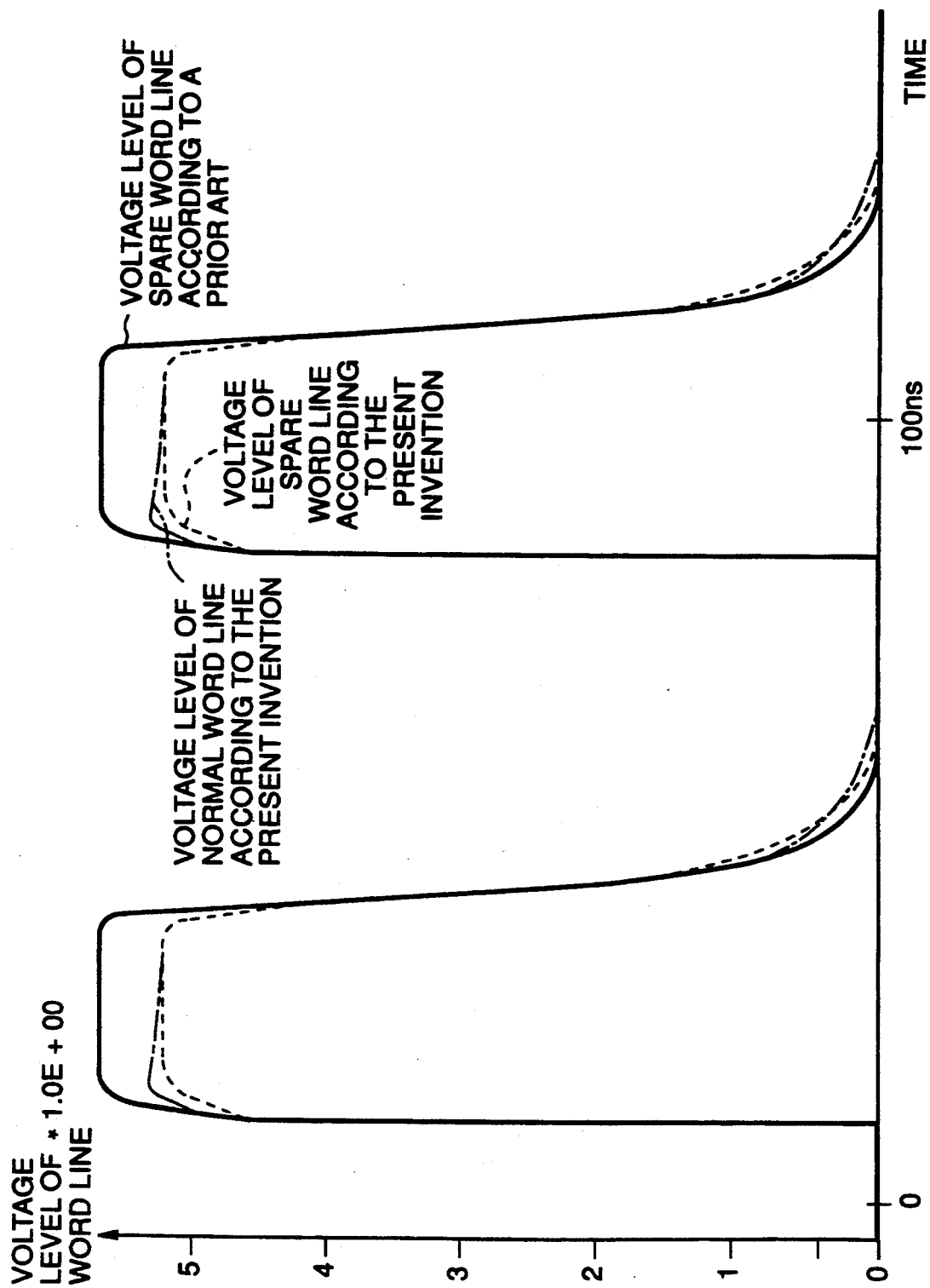
FIG. 8 is waveforms illustrating the output characteristic of the voltage level of a word line of FIG. 6.

FIG. 8 shows the output characteristic of FIG. 6, illustrating that the voltage levels supplied to the normal word line connected to the normal cell array and to the spare word line connected to the spare cell array are similar to each other. As shown, when the voltage level of the word line is supplied, the voltage level supplied to the normal word line and that supplied to the spare word line is similar to each other. Therefore the loading of the spare word line is greatly reduced.

While preferred embodiments of the present invention have been particularly shown and described, it will be understood by those skilled in the art that foregoing and other changes in form and details may be made without departing from the spirit and scope of the present invention.

What is claimed is:

1. A semiconductor integrated circuit comprising:
   first and second memory cell arrays, each containing a plurality of memory cells for storing data;
   a first row decoder for selecting memory cells of said first memory cell array;
   a second row decoder for selecting memory cells of said second memory cell array;
   a word line boosting circuit connected to said first and second row decoders for generating a boosting voltage over a supply voltage when accessing selected data from a selected memory cell during an access operation; and
   a word line boosting control circuit for adjusting an output level of said word line boosting circuit to a first output level when said first and second memory cell arrays are simultaneously selected and to a second output level different than said first output level when said first and second memory cell arrays are independently selected so that word line selection signals transmitted to said memory arrays have substantially the same voltage whether said first and second memory cell arrays are simultaneously selected or are independently selected, said word line boosting control circuit receiving block select information indication selection of said memory arrays.

2. A semiconductor integrated circuit according to claim 1, wherein said word line boosting control circuit comprises
   a pass transistor that receive through a channel of said pass transistor said block select information;
   a pull-down transistor having a gate connected to said channel of said pass transistor and a channel of said pull-down transistor having one end connected to an output terminal of said word line boosting circuit; and
   a capacitor connected between a second end of said channel of said pull-down transistor and a ground voltage terminal for discharging current flowing into the channel of said pull-down transistor.

3. A semiconductor integrated circuit according to claim 1, wherein said first output level of said word line boosting circuit is greater than said second output level.

4. A semiconductor integrated circuit according to claim 2, wherein said first output level of said word line boosting circuit is greater than said second output level.

5. A semiconductor integrated circuit according to claim 4 wherein said first output level is reduced by said capacitor using a capacitance having a value that substantially corresponds to a difference between parasitic capacitances of said first and second memory cell arrays.

6. A semiconductor integrated circuit comprising:
   a normal memory cell array containing a plurality of memory cells for storing data;
   an extra cell arrays included in said normal cell array containing a plurality of extra memory cells for storing extra data;
   a word line boosting circuit for generating a boosting voltage over a supply voltage; and
   a word line boosting control circuit, connected to receive block select information and said boosting voltage from said word line boosting circuit, for selectively generating one of a first word line voltage and a second word line voltage from said boosting voltage, said second word line voltage having a different voltage level than said first word line voltage so that word line selection signals transmitted to said normal memory array and said extra memory array have substantially the same voltage when said normal memory array is selected independently from or together with said extra memory array.

7. A semiconductor integrated circuit according to claim 6, wherein said word line boosting control circuit comprises:
   a logic gate, connected to receive at a first input an output signal from an output of said word line boosting circuit, at a second input a delayed output signal generated from a delay circuit, said delay circuit connected to said output of said word line boosting circuit, and at a third input said block select information, said logic gate providing a logic gate output signal at a logic gate output indicative of whether to generate said first word line voltage or said second word line voltage; and
   a pull-down transistor, having a gate connected to said logic gate output and a channel connected at a first end to said output of said word line boosting circuit that receives said boosted voltage, for discharging a predetermined voltage from said boosted voltage when said gate receives said logic gate output signal.

8. A semiconductor integrated circuit according to claim 6 wherein said first word line voltage is higher than said second word line voltage and is generated when said normal cell array and said extra cell array are simultaneously selected, and wherein said second word line voltage is generated when only said normal memory cell array is selected.

9. A semiconductor integrated circuit according to claim 7 wherein said first word line voltage is higher than said second word line voltage and is generated when said normal cell array and said extra cell array are simultaneously selected, and wherein said second word line voltage is generated when only said normal memory cell array is selected.

10. A word line boosting control circuit for use in a semiconductor integrated circuit having a normal memory cell array for storing data in a plurality of memory cells, a plurality of extra cell arrays for storing extra data in extra memory cells, a row decoder for decoding a row address associated with said normal memory cell arrays and said extra cell arrays and a word line boosting circuit for supplying a boosted voltage higher than a supply voltage at an output terminal thereof to said row decoder, said extra cell arrays being adjacent to said normal memory cell array, said word line boosting control circuit comprising:
- a logic gate, connected to receive at a first input an output signal from an output of said word line boosting circuit, at a second input a delayed output signal generated from a delay circuit, said delay circuit connected to said output of said word line boosting circuit, and at a third input block select information, said logic gate providing a logic gate output signal at a logic gate output indicative of whether to generate a first word line voltage or a second word line voltage; and
- a pull-down transistor, having a gate connected to said logic gate output and a channel connected at a first end to said output of said word line boosting circuit that receives said boosted voltage, for discharging a predetermined voltage from said boosted voltage when said gate receives said logic gate output signal.

11. A semiconductor integrated circuit according to claim 10 wherein said first word line voltage is higher than said second word line voltage and is generated when said normal cell array and said extra cell array are simultaneously selected, and wherein said second word line voltage is generated when only said normal memory cell array is selected.

12. A word line boosting circuit for use in a semiconductor integrated circuit having a normal memory cell array for storing data in memory cells as main memory and a spare cell array for storing said data in spare cells as auxiliary memory, said word line boosting circuit comprising:
- a normal word line boosting circuit, connected to said normal memory cell array, for boosting a normal word line to a first voltage level within said normal memory cell array;
- a spare word line boosting circuit, connected to said spare cell array, for boosting a spare word line to a second voltage level within said spare cell array; and
- a spare word line boosting control circuit connected to an output terminal of said spare word line, for controlling said second voltage level so that said memory cells are supplied with word line signals having a substantially constant voltage level irrespective of loading of said spare word line.

13. A word line boosting circuit according to claim 12, wherein said spare word line boosting control circuit comprises a capacitor.

14. A word line boosting circuit according to claim 13, wherein said spare word line boosting control circuit includes an NMOS diode with an input terminal connected to an output terminal of said spare word line boosting circuit.

* * * * *